United States Patent
Hou et al.

(10) Patent No.: US 10,367,348 B2
(45) Date of Patent: Jul. 30, 2019

(54) SWITCH-MODE POWER SUPPLY AND CONTROL HAVING PROTECTION FROM A SHORT-CIRCUITED CURRENT SENSING RESISTOR

(71) Applicant: BYD COMPANY LIMITED, Shenzhen, Guangdong (CN)

(72) Inventors: Yongjun Hou, Shenzhen (CN); Wenqing Wang, Shenzhen (CN)

(73) Assignee: BYD COMPANY LIMITED, Shenzhen, Guangdong (CN)

( * ) Notice: Subject to any disclaimer, the term of this patent is extended or adjusted under 35 U.S.C. 154(b) by 0 days.

(21) Appl. No.: 15/769,316

(22) PCT Filed: Nov. 24, 2016

(86) PCT No.: PCT/CN2016/107136
§ 371 (c)(1),
(2) Date: Apr. 18, 2018

(87) PCT Pub. No.: WO2017/088799
PCT Pub. Date: Jun. 1, 2017

(65) Prior Publication Data
US 2018/0309283 A1 Oct. 25, 2018

(30) Foreign Application Priority Data
Nov. 26, 2015 (CN) .......................... 2015 1 0836236

(51) Int. Cl.
*H02M 1/32* (2007.01)
*H02H 7/122* (2006.01)
(Continued)

(52) U.S. Cl.
CPC ........ *H02H 7/1225* (2013.01); *H02H 7/1216* (2013.01); *H02M 1/32* (2013.01);
(Continued)

(58) Field of Classification Search
CPC .. G01R 31/025; G01R 31/024; G01R 31/013; H02M 1/32; H02M 3/33507; H02H 7/1225
See application file for complete search history.

(56) References Cited

U.S. PATENT DOCUMENTS 8,325,451 B2 * 12/2012 Mitsuda ............. H03K 17/0822
361/93.1
2006/0028847 A1 2/2006 Ryu et al.
(Continued)

FOREIGN PATENT DOCUMENTS

CN 101969188 A 2/2011
CN 102624240 A 8/2012
(Continued)

OTHER PUBLICATIONS

International Search Report from PCT/CN2016/107136 dated Mar. 9, 2017 (3 pages).

*Primary Examiner* — Harry R Behm
(74) *Attorney, Agent, or Firm* — Calfee Halter & Griswold LLP

(57) ABSTRACT

The present disclosure provides a control apparatus of a switch-mode power supply and a switch-mode power supply. In the control apparatus of the present disclosure, a short-circuit protection module is set, and when a switching transistor of the switch-mode power supply is turned on, and the short-circuit protection module detects that a voltage across a current sensing resistor of the switch-mode power supply is less than a predetermined value within a predetermined period, that is, the current sensing resistor is short-circuited, the short-circuit protection module generates a short-circuit protection signal, and a driving controller controls the switching transistor to turn off according to the protection signal, thereby switching off the control appara-
(Continued)

tus, preventing breakdown of the switch-mode power supply, and avoiding erroneous protection.

18 Claims, 8 Drawing Sheets

(51) Int. Cl.
    *H02H 7/12*     (2006.01)
    *H02M 3/335*     (2006.01)
    *H02M 3/156*     (2006.01)
    *H02M 7/217*     (2006.01)
    *G01R 31/02*     (2006.01)

(52) U.S. Cl.
    CPC ....... *H02M 3/156* (2013.01); *H02M 3/33507* (2013.01); *H02M 7/217* (2013.01); *G01R 31/025* (2013.01)

(56) References Cited

U.S. PATENT DOCUMENTS

| | | | |
|---|---|---|---|
| 2007/0217095 A1 | 9/2007 | Choi et al. | |
| 2008/0232018 A1* | 9/2008 | Yang | H02M 1/32 361/94 |
| 2010/0320989 A1* | 12/2010 | Chang | H02M 3/33523 323/285 |
| 2013/0033197 A1 | 2/2013 | Hwang et al. | |
| 2013/0223107 A1* | 8/2013 | Zhang | H02M 3/33523 363/21.16 |
| 2013/0293270 A1* | 11/2013 | Lee | H03K 5/00006 327/113 |
| 2014/0078790 A1* | 3/2014 | Lin | H02M 3/33507 363/21.16 |
| 2014/0078792 A1 | 3/2014 | Yabuzaki | |
| 2015/0168476 A1* | 6/2015 | Park | G01R 31/025 324/549 |
| 2016/0081148 A1* | 3/2016 | Liang | H05B 33/089 324/414 |

FOREIGN PATENT DOCUMENTS

| | | |
|---|---|---|
| CN | 203180779 U | 9/2013 |
| CN | 103401428 A | 11/2013 |
| CN | 203800836 U | 8/2014 |
| CN | 10473510 A | 6/2015 |
| CN | 104734510 A | 6/2015 |
| CN | 205070404 U | 3/2016 |
| DE | 4310513 C1 | 6/1994 |

* cited by examiner

US 10,367,348 B2

SWITCH-MODE POWER SUPPLY AND CONTROL HAVING PROTECTION FROM A SHORT-CIRCUITED CURRENT SENSING RESISTOR

CROSS REFERENCE TO RELATED APPLICATION

The present application is based on International Application No. PCT/CN2016/107136, filed on Nov. 24, 2016, which claims the priority of Chinese Patent Application No. 201510836236.3, filed on Nov. 26, 2015, the entire contents of which are herein incorporated by reference.

FIELD

The present disclosure relates to the field of power supply control technologies, and in particular, to a control apparatus of a switch-mode power supply and a switch-mode power supply.

BACKGROUND

FIG. 1 shows a typical switch-mode power supply circuit. After being subject to full-wave rectification (of a rectification bridge consisting of diodes D11, D12, D13, and D14) and a π-type filtering circuit consisting of capacitors C12 and C13 and an inductor L11, an alternating current is then converted into a high-voltage direct current, in which D13 and C11 at a secondary side form a secondary rectification filtering network that rectifies and filters a voltage at a secondary side of a transformer. A starting circuit that is formed by R13 and C14 and that is derived from the π-type filtering circuit provides a starting voltage to a control chip. Resistors R14 and R15 form a feedback voltage dividing network, and a sampling circuit in the control chip samples an output voltage coupled to a feedback winding Lk by using the feedback voltage dividing network. After sampling the output voltage, the control chip generates a control signal by means of internal processing to control a switching transistor T1 to turn on/off, thereby adjusting the magnitude of input power, so as to adapt to a change in an output load. The control chip performs current-limiting on a primary side inductor of the transformer via the current sensing resistor R12, to prevent a current flowing through the switching transistor T1 from being excessively large. However, in a production process of the switch-mode power supply, the current sensing resistor R12 is often short-circuited due to some reasons such as undesired production and device failure. After the R12 is short-circuited, current-limiting cannot be performed on the primary side inductor of the transformer. When the switching transistor T1 is switched on, the current continuously rises until the switching transistor T1 is damaged because of excessively high power or even the switch-mode power supply is broken down, thus causing a potential safety hazard during test and use.

Currently, in general practices of switch-mode power supply manufacturers, these defective products are screened out in a test process, so as to prevent these defective products from being delivered to users. Alternatively, a turn-on time of the primary side inductor is limited. That is, after the switching transistor T1 is switched on, a fixed delay time Ton is waited for, and if the voltage on the current sensing resistor R12 does not reach a maximum value in this time, it is judged that the current sensing resistor R12 is short-circuited, and the switching transistor T1 is switched off, thereby switching off the control chip.

SUMMARY

The present disclosure aims to solve at least one of problems existing in the related art.

To this end, embodiments of a first aspect of the present disclosure provide a control apparatus of a switch-mode power supply. The control apparatus includes: a driving controller, configured to collect an output voltage signal of a feedback winding of the switch-mode power supply, and to generate a driving signal for driving a switching transistor of the switch-mode power supply to turn on or off according to the output voltage signal; and a short-circuit protection module, configured to detect a voltage across a current sensing resistor of the switch-mode power supply, to generate a short-circuit protection signal when the switching transistor of the switch-mode power supply is turned on and the voltage across the current sensing resistor is less than a predetermined value within a predetermined period, and to output the short-circuit protection signal to the driving controller, in which the driving controller is further configured to control the switching transistor to turn off according to the short-circuit protection signal.

According to the control apparatus of the switch-mode power supply provided by embodiments of the present disclosure, a short-circuit protection module is set, and when the switching transistor of the switch-mode power supply is turned on, and the short-circuit protection module detects in the predetermined period that the voltage across the current sensing resistor of the switch-mode power supply is less than the predetermined value, that is, the current sensing resistor is short-circuited, the short-circuit protection module generates the short-circuit protection signal, and the driving controller controls the switching transistor to turn off according to the protection signal, thereby switching off the control apparatus, preventing breakdown of the switch-mode power supply, and avoiding erroneous protection.

Embodiments of a second aspect of the present disclosure provide a switch-mode power supply. The switch-mode power supply includes: a rectification module, configured to rectify an input AC voltage into a DC voltage; a transformer, including a primary winding, a secondary winding and a feedback winding; a rectification and filtering module, connected to the secondary winding of the transformer, and configured to rectify and filter a voltage output by the secondary winding; a switching transistor and a current sensing resistor, in which a first output end of the switching transistor is connected to the primary winding of the transformer, a second output end of the switching transistor is connected to a first end of the current sensing resistor, and a second end of the current sensing resistor is grounded; and a control apparatus, in which the control apparatus includes a driving controller and a short-circuit protection module, the driving controller is connected to the feedback winding and an input end of the switching transistor respectively, and is configured to collect an output voltage signal of the feedback winding, and to generate a driving signal for driving the switching transistor to turn on or off according to the output voltage signal, the short-circuit protection module is connected to the driving controller and the first end of the current sensing resistor respectively, and is configured to detect a voltage across the current sensing resistor, to generate a short-circuit protection signal when the switching transistor is turned on and the voltage across the current sensing resistor is less than a predetermined value within a predetermined period, and to output the short-circuit protection signal to the driving controller, the driving controller is further configured to control the switching transistor to turn off according to the short-circuit protection signal.

According to the switch-mode power supply provided by embodiments of the present disclosure, a short-circuit protection module is set in the control apparatus of the switch-mode power supply, and when the switching transistor of the switch-mode power supply is turned on, and the short-circuit protection module detects in the predetermined period that the voltage across the current sensing resistor of the switch-mode power supply is less than the predetermined value, that is, the current sensing resistor is short-circuited, the short-circuit protection module generates the short-circuit protection signal, and the driving controller controls the switching transistor to turn off according to the protection signal, thereby switching off the control apparatus, preventing breakdown of the switch-mode power supply, and avoiding erroneous protection.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
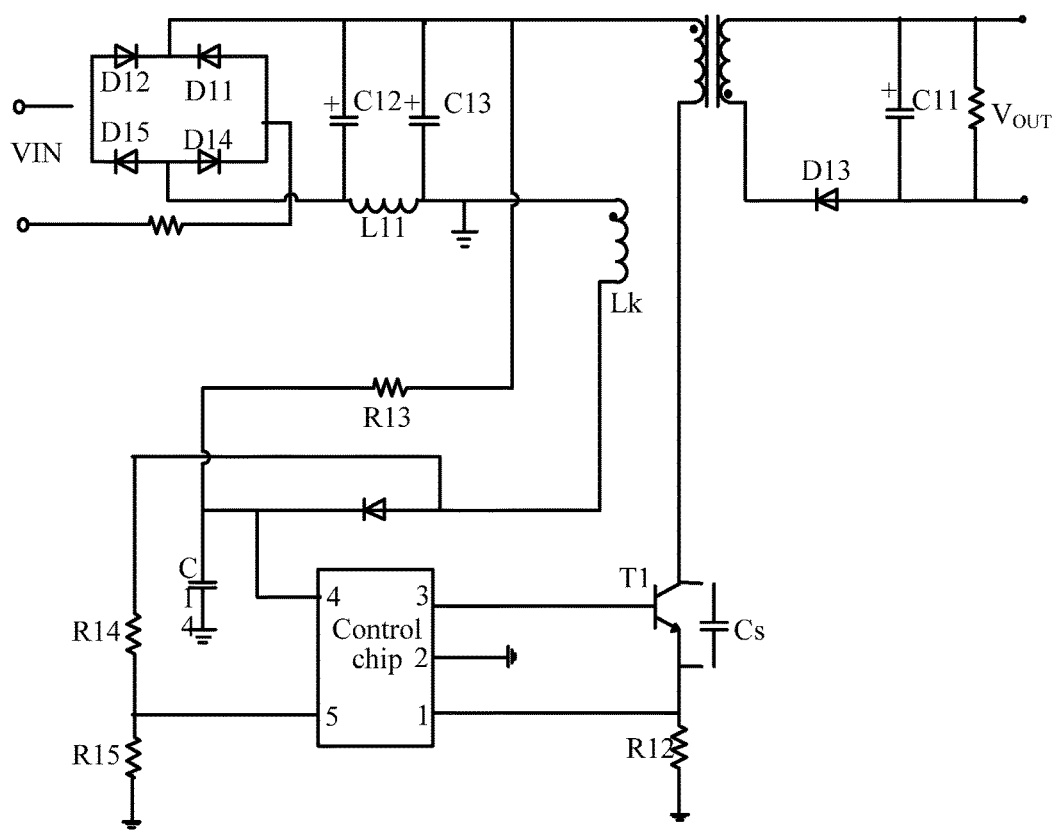
FIG. 1 is a circuit diagram of a conventional switch-mode power supply.

Reference will be made in detail to embodiments of the present disclosure. The embodiments described herein with reference to drawings are explanatory, illustrative, and should be used to generally understand the present disclosure. The embodiments shall not be construed to limit the present disclosure. The same or similar elements and the elements having same or similar functions are denoted by like reference numerals throughout the descriptions.

The disclosure hereinafter provides lots of different embodiments or examples to achieve different structures of the present disclosure. In order to simplify the disclosure of the present disclosure, components and settings of specific examples are described hereinafter. Certainly, they are merely examples, and are not intended to limit the present disclosure. In addition, the present disclosure can repeat reference numbers and/or reference letters in different examples, but such repetitions are for simplification and clarity, which do not indicate relationships between the embodiments and/or settings discussed.

In the description of the present disclosure, it should be understood that, unless specified or limited otherwise, the terms "mounted", "connected", "linked" and "coupled" should be understood broadly, for example, which may be mechanical connections, electrical connections or communications inside two elements; may be direct connections, indirectly connected with each other through an intermediate medium. Those of ordinary skill in the art can understand specific meanings of the terms according to specific situations.

With reference to the following descriptions and accompanying drawings, these and other aspects of the embodiments of the present disclosure are understood. In these descriptions and accompanying drawings, some particular implementation manners in the embodiments of the present disclosure are specifically disclosed, to denote some manners of principles for implementing the embodiments of the present disclosure, but it should be understood that, the scope of the embodiments of the present disclosure is not limited thereto. Instead, the embodiments of the present disclosure include all changes, modifications and equivalents that fall within the scope of the spirit and connotation of appended claims.

A control apparatus of a switch-mode power supply provided according to an embodiment of the present disclosure is described first with reference to accompanying drawings.

The inventor finds that, there are at least following problems in the related art. A solution of screening out these defective products in the test process is inefficiency, and costs are high. For a solution of limiting the turn-on time of the primary side inductor, the current of the primary side inductor is not only related to the turn-on time of the switching transistor T1, but also related to a rise slope of the current. When an input voltage is relatively low, the rise slope of the current of the primary side inductor is relatively small, and if the primary side Ton is set to be excessively small, erroneous protection is easily caused. When the input voltage increases, the rise slope of the current of the primary side inductor increases, a current peak is also larger in the same time, and if the primary side Ton is set to be excessively large, breakdown is likewise caused. Therefore, the solution in which the turn-on time is fixed generally causes erroneous protection when the input voltage is relatively low, and also fails when the input voltage is relatively high.

The inventor also finds that, when a conventional switch-mode power supply operates, as shown in FIG. 1, an output end of a switching transistor T1 is inherently connected in parallel to a parasitic capacitor Cs, in which the parasitic capacitor Cs mainly consists of a parasitic capacitor of the switching transistor T1 and a parasitic capacitor of a transformer. When the switching transistor T1 is turned off, an input voltage Vin of the switch-mode power supply is directly applied to the output end of the switching transistor T1, and then the parasitic capacitor Cs stores energy $\frac{1}{2} \cdot C_s \cdot V_{in}^2$. When the switching transistor T1 is turned on, the input voltage Vin is applied to a primary coil. In this case, a current Ik on the primary coil linearly increases from 0 to a maximum value Ikk, and the primary coil stores energy $\frac{1}{2} \cdot Lk \cdot Ikk^2$. Moreover, since the parasitic capacitor Cs is short-circuited by the switching transistor T1, the energy stored in the parasitic capacitor Cs is quickly released to the ground via the switching transistor T1, and a discharge current is Is. Therefore, a current I1 flowing through the switching transistor T1 is I1=Ik+Is.

Since the discharge current Is of the parasitic capacitor Cs is an inherent discharge current of the switching transistor T1, and is irrelevant to the current of the primary coil, and a discharge period is short, the discharge current may be sampled in an extremely short time period, and in this time period, the current Ik of the primary coil hardly increases. Therefore, a voltage across a current sensing resistor may be detected in a predetermined period, and if the voltage is less than a preset judgment threshold, it is considered that the current sensing resistor is short-circuited. In this case, a control chip switches off the switching transistor T1 until the control chip is powered off and then is restarted.

Figure 2:
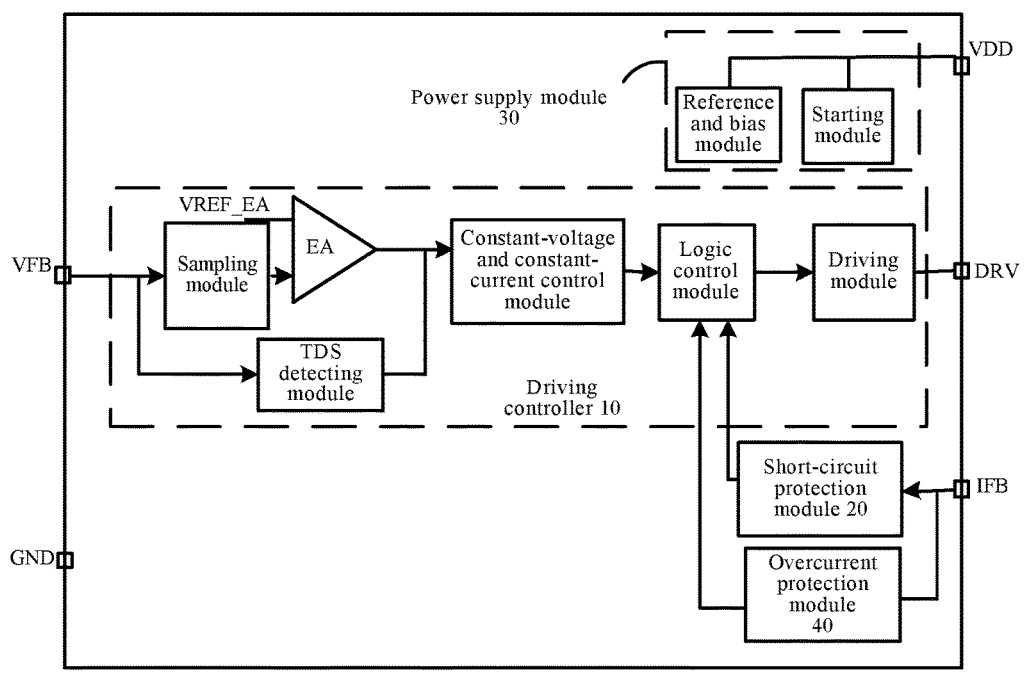
FIG. 2 is a schematic diagram of a control apparatus of a switch-mode power supply according to an embodiment of the present disclosure.

Based on the foregoing finding, an embodiment of the present disclosure provides a control apparatus of a switch-mode power supply. As shown in FIG. 2, the control apparatus 100 includes a driving controller 10, a short-circuit protection module 20 and a power supply module 30. The power supply module 30 supplies power to the driving controller 10 and the short-circuit protection module 20. The driving controller 10 is configured to collect an output voltage signal of a feedback winding of the switch-mode power supply, and to generate a driving signal for driving a switching transistor of the switch-mode power supply to turn on or off according to the output voltage signal. The short-circuit protection module 20 is configured to detect a voltage across a current sensing resistor of the switch-mode power supply, to generate a short-circuit protection signal when the switching transistor of the switch-mode power supply is turned on and the voltage across the current sensing resistor is less than a predetermined value in a predetermined period, and to output the short-circuit protection signal to the driving controller 10. The driving controller 10 is further configured to control the switching transistor to turn off according to the short-circuit protection signal.

According to the control apparatus of the switch-mode power supply provided by this embodiment, the short-circuit protection module 20 is set, and when the switching transistor of the switch-mode power supply is turned on, and the short-circuit protection module 20 detects in the predetermined period that the voltage across the current sensing resistor of the switch-mode power supply is less than the predetermined value, that is, the current sensing resistor is short-circuited, the short-circuit protection module 20 generates the short-circuit protection signal, and the driving controller 10 controls the switching transistor to turn off according to the protection signal, thereby switching off the control apparatus 100, preventing breakdown of the switch-mode power supply, and avoiding erroneous protection.

For convenience of description, in the following embodiments of the present disclosure, the control apparatus 100 is defined as an apparatus/chip that has five ends/pins, that is, an apparatus/chip that has a VDD end, a DRV end, a VFB end, an IFB end and a GND end. An external power supply is provided to the power supply module 30 via the VDD end. The driving controller 10 outputs the driving signal for controlling the switching transistor to turn on or off via the DRV end. The output voltage signal of the feedback winding of the switch-mode power supply is collected into the driving controller 10 via the VFB end. The short-circuit protection module 20 detects the voltage across the current sensing resistor of the switch-mode power supply via the IFB end. the GND end is grounded, and provides the ground to the control apparatus 100, that is, all grounded components of the control apparatus 100 are connected to the GND end.

Figure 3:
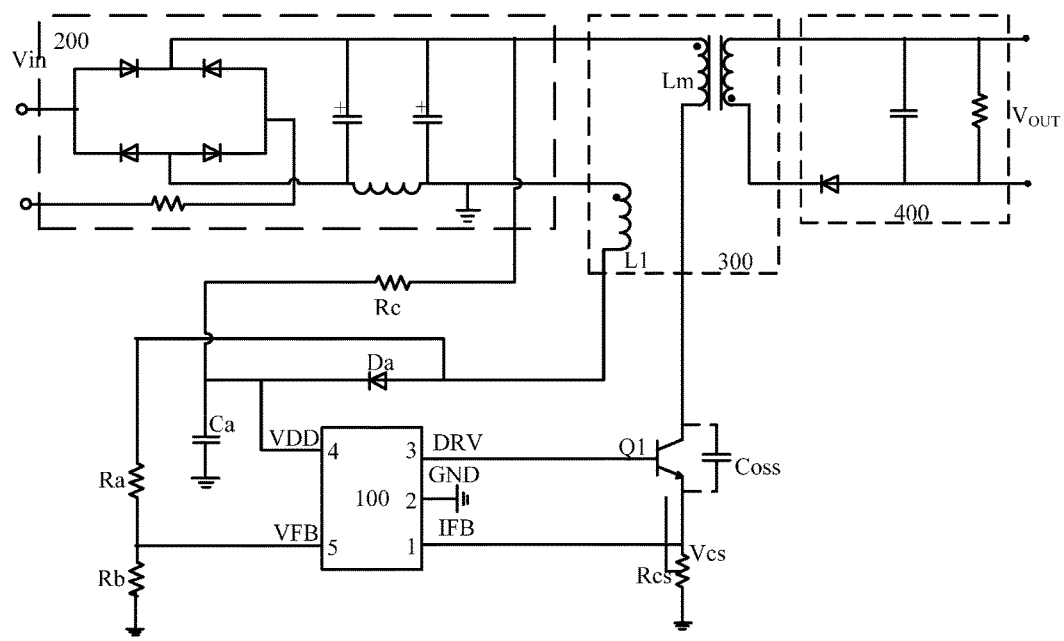
FIG. 3 is a circuit diagram of a switch-mode power supply according to an embodiment of the present disclosure.

FIG. 3 is a circuit diagram of a switch-mode power supply according to an embodiment of the present disclosure. As shown in FIG. 3, the switch-mode power supply includes a rectification module 200, a transformer 300, a rectification and filtering module 400, a switching transistor Q1 and a current sensing resistor Rcs, and a control apparatus 100. The rectification module 200 is configured to rectify an input AC voltage into a DC voltage. Specifically, the rectification module 200 includes a rectification bridge consisting of four diodes, and a π-type filtering circuit consisting of two capacitors and one inductor. The rectification module 200 converts an alternating current into a high-voltage direct current by using the rectification bridge and the π-type filtering circuit. The transformer 300 includes a primary winding Lm, a secondary winding and a feedback winding L1. The rectification and filtering module 400 is connected to the secondary winding of the transformer 300, and is configured to rectify and filter a voltage output by the secondary winding, and to output a direct current. A first output end of the switching transistor Q1 is connected to the primary winding L1 of the transformer 300, a second output end of the switching transistor Q1 is connected to a first end of the current sensing resistor Rcs, and a second end of the current sensing resistor Rcs is grounded. The control apparatus 100 includes a driving controller 10 and a short-circuit protection module 20. The driving controller 10 is connected to the feedback winding L1 and an input end of the switching transistor Q1 respectively, and is configured to collect an output voltage signal of the feedback winding L1, and to generate a driving signal for driving the switching transistor Q1 to turn on or off according to the output voltage signal. The short-circuit protection module 20 is connected to the driving controller 10 and the first end of the current sensing resistor Rcs, and is configured to detect a voltage across the current sensing resistor Rcs, to generate a short-circuit protection signal when the switching transistor Q1 is turned on and the voltage across the current sensing resistor Rcs is less than a predetermined value in a predetermined period. The driving controller 10 controls the switching transistor Q1 to turn off according to the short-circuit protection signal.

The switching transistor Q1 may be of any type. In this embodiment, an example in which the switching transistor Q1 is an IGBT is used for description, in which the first output end of the switching transistor Q1 is a collector of the IGBT, the second output end of the switching transistor Q1 is an emitter of the IGBT, a switch capacitor Coss is connected in parallel to the output end of the switching transistor Q1, that is, one end of the switch capacitor Coss is connected to the collector of the IGBT, the other end is connected to the emitter of the IGBT, and the input end of the switching transistor Q1 is a grid of the IGBT.

Specifically, the control apparatus 100 is connected via the VDD end to a starting circuit consisting of Rc and Ca derived from the π-type filtering circuit, and the starting circuit provides a starting voltage to the control apparatus 100, and provides energy to a primary side power loop after the control apparatus 100 is switched on. The DRV end is connected to the gate electrode of the switching transistor Q1. The voltage signal output by the feedback winding L1 is output to the VFB end through a feedback voltage dividing network consisting of resistors Ra and Rb. The IFB end is connected to the first end of the current sensing resistor Rcs and the emitter of the switching transistor Q1, and the GND end is grounded.

Figure 4:
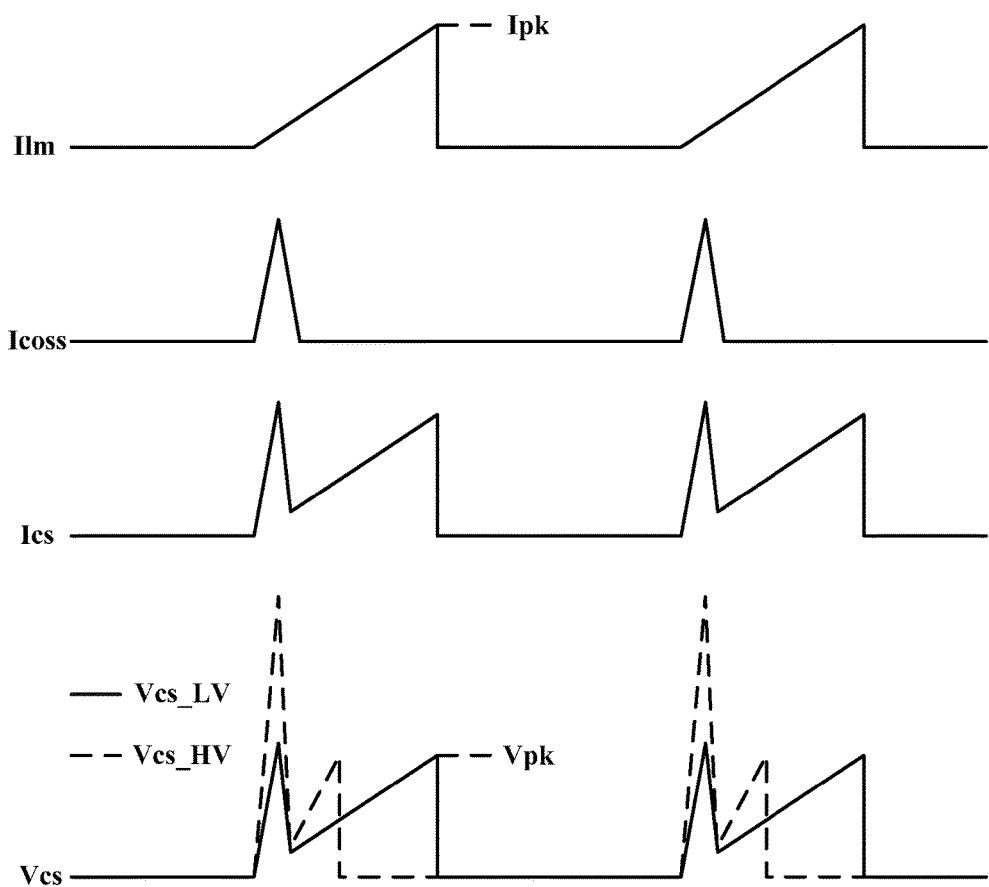
FIG. 4 is a schematic diagram of a working sequence of a switch-mode power supply according to an embodiment of the present disclosure.

FIG. 4 is an operating current/voltage waveform graph of a switch-mode power supply according to an embodiment of the present disclosure. As shown in FIG. 4, Ilm is a current of a primary side inductor, Ipk refers to a current peak of the primary side inductor, Icoss is a discharge current of a switch capacitor Coss, Ics is an output current of the switching transistor Q1, Vcs is the voltage over the current sensing resistor Rcs, Vpk is a peak voltage on the current sensing resistor, Vcs_LV is a voltage on the current sensing resistor Rcs in a case of low-voltage input, Vcs_HV is a voltage on the current sensing resistor Rcs in a case of high-voltage input, and Vref is a reference voltage for judging short-circuit. It can be seen that, Icoss is an inherent discharge current of the switching transistor Q1 in the system, and is irrelevant to a current of an inductor, and may be sampled in an extremely short time period since the discharge period is short, and in this time period, the current of the inductor hardly increases. Therefore, the voltage Vcs is detected in a predetermined period, and if the voltage Vcs is less than a preset judgment threshold, it is considered that the current sensing resistor Rcs is short-circuited. In this case, the control chip switches off the switching transistor Q1 until the control chip is powered off and then is restarted.

According to the switch-mode power supply of this embodiment of the present disclosure, the short-circuit protection module 20 is set in the control apparatus 100 of the switch-mode power supply, and when the switching transistor Q1 of the switch-mode power supply is turned on, and the short-circuit protection module 20 detects in the predetermined period that the voltage across the sensing resistor Rcs of the switch-mode power supply is less than the predetermined value, that is, the current sensing resistor Rcs is short-circuited, the short-circuit protection module 20 generates the short-circuit protection signal, and the driving controller 10 controls the switching transistor Q1 to turn off according to the protection signal, thereby switching off the control apparatus 100, preventing breakdown of the switch-mode power supply, and avoiding erroneous protection.

In an embodiment, the predetermined period is greater than or equal to a discharge period of the switch capacitor Coss connected in parallel to the switching transistor Q1, in which the switch capacitor Coss consists of a parasitic capacitor of the switching transistor Q1 and a parasitic capacitor of a transformer of the switch-mode power supply.

Further, the control apparatus 100 further includes an overcurrent protection module 40. The overcurrent protection module 40 is connected to the driving controller 10, the overcurrent protection module 40 is configured to detect a current flowing through the switching transistor Q1, to generate an overcurrent protection signal when the current flowing through the switching transistor Q1 is greater than a threshold and to output the overcurrent protection signal to the driving controller 10. The driving controller 10 controls the switching transistor Q1 to turn off according to the overcurrent protection signal. A priority of turning off the switching transistor Q1 in the overcurrent protection module 40 is lower than a priority of turning off the switching transistor Q1 in the short-circuit protection module, that is, when overcurrent and short-circuit of the current sensing resistor occur at the same time, the control apparatus 100 preferentially performs the short-circuit protection.

In another embodiment, the driving controller 10 includes a sampling module, an error amplifier, a TDS detecting module, as well as a constant-voltage and constant-current control module, a logic control module, and a driving module connected in series. An input end of the sampling module is configured to receive the output voltage signal of the feedback winding, and the sampling module is configured to sample the output voltage signal of the feedback winding. A negative input end of the error amplifier is connected to an output end of the sampling module. An input end of the TDS detecting module is connected to the input end of the sampling module, and an output end of the TDS detecting module is connected to an output end of the error amplifier. An input end of the constant-voltage and constant-current control module is connected to the output end of the error amplifier. The driving module is configured to generate the driving signal for driving the switching transistor to turn on or off according to a logic signal output by the logic control module. The overcurrent protection module and the short-circuit protection module are connected to the logic control module.

Further, the power supply module 30 includes a starting module and a reference and bias module. The starting module is configured to implement delayed starting on the control apparatus and provide an enable signal to the control apparatus 100. The reference and bias module is configured to provide a reference voltage and a bias voltage to internal circuits of the control apparatus, for example, the sampling module, the error amplifier, the TDS detecting module, the constant-voltage and constant-current control module, the logic control module, the driving module, the overcurrent protection module, the short-circuit protection module and the like.

An operating principle of the switch-mode power supply is described below with reference to FIG. 2 to FIG. 4. After the switch-mode power supply is connected to a mains supply, the rectification module 200 begins to operate and rectifies an input AC mains supply into a DC voltage, and also provides a switch-on voltage to the control apparatus 100. When the voltage at the VDD end reaches the switch-on voltage, the starting module of the power supply module 30 generates an enable signal, to enable the internal circuits, and moreover the reference and bias module generates a reference signal and a bias signal of the internal circuits, so as to provide the reference voltage and the bias voltage to the internal circuits. The VFB end collects the output voltage signal of the feedback winding L1, and feeds the voltage signal into the error amplifier. The error amplifier compares the voltage signal and a reference voltage signal VREF_EA and outputs an amplified error signal. The output signal of the error amplifier is fed into the constant-voltage and constant-current control module, and the constant-voltage and constant-current control module generates a control signal according to the output signal, where the control signal is used to adjust an operating frequency and a duty cycle of the switch-mode power supply. The logic control module performs logic processing on the control signal generated by the constant-voltage and constant-current control module, to finally generate a control signal for controlling an operation of the switch-mode power supply, which is input to the driving module. The driving module receives this switch control signal, and generates a driving signal and outputs the driving signal to the DRV end. The DRV end is configured to drive the switching transistor Q1 to turn on or off, so as to adjust primary side input power of the switch-mode power supply, so that the switch-mode power supply stably operates. Moreover, the overcurrent protection module 40 detects a current flowing through the switching transistor Q1 via the IFB end, generates an overcurrent protection signal when the current flowing through the switching transistor Q1 is greater than a threshold, and outputs the overcurrent protection signal to the logic control module. The logic control module generates a logic instruction and outputs the logic instruction to the switching transistor Q1 for controlling the switching transistor Q1 to turn off. The short-circuit protection module 20 also detects the voltage on the current sensing resistor Rcs via the IFB end, and when the switching transistor Q1 is turned on and a voltage across the current sensing resistor is less than a predetermined value in a predetermined period, that is, the current sensing resistor Rcs is short-circuited, the short-circuit protection module 20 generates a short-circuit protection signal and outputs the short-circuit protection signal to the logic control module. The logic control module generates a control signal according to the short-circuit protection signal and inputs the control signal to the driving module, such that the driving module generates the driving signal to control the switching transistor Q1 to turn off until the control apparatus 100 is powered off and then restarted.

Figure 5:
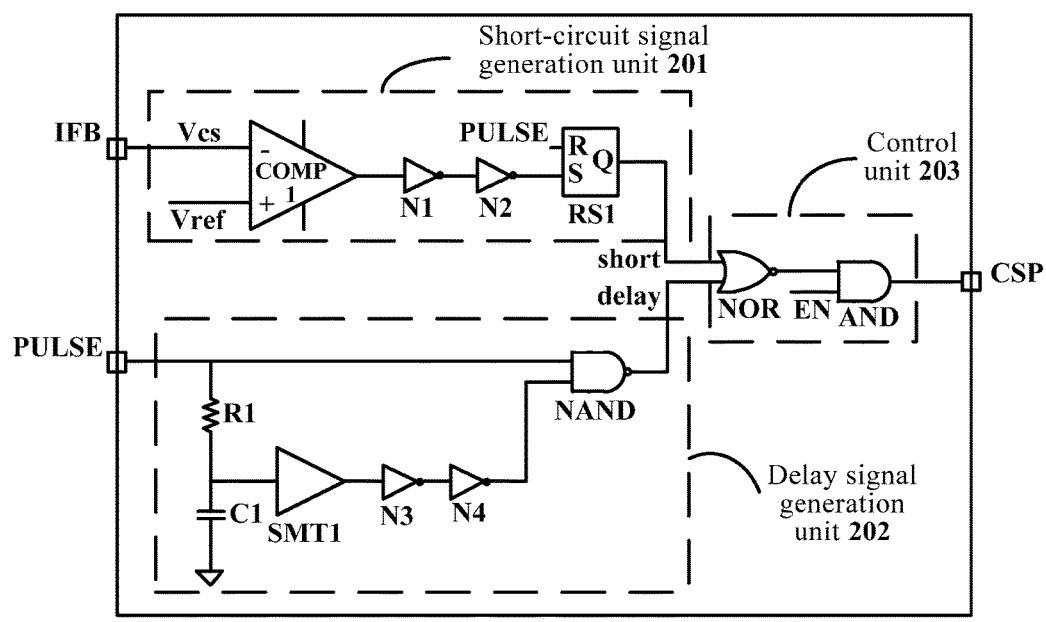
FIG. 5 is a schematic diagram of a short-circuit protection module of a control apparatus of a switch-mode power supply according to an embodiment of the present disclosure.

FIG. 5 is a schematic diagram of a short-circuit protection module of a control apparatus of a switch-mode power supply according to an embodiment of the present disclosure. As shown in FIG. 5, the short-circuit protection module 20 includes a short-circuit signal generation unit 201, a delay signal generation unit 202, and a control unit 203. The short-circuit signal generation unit 201 is configured to collect the voltage across the current sensing resistor Rcs and to generate the short-circuit signal. The delay signal generation unit 202 is configured to generate a delay signal according to a logic control signal synchronous with the driving signal. The control unit 203 is connected to the short-circuit signal generation unit 201 and the delay signal generation unit 202 respectively, and is configured to generate the short-circuit protection signal according to the short-circuit signal and the delay signal.

For convenience of description, in the following embodiment, an input end of the delay signal generation unit 202 that receives the logic control signal synchronous with the driving signal is defined as a PULSE end, and the PULSE end is connected to an output end of the logic control module in the driving controller 10. An output end of the control unit 203 that outputs the short-circuit protection signal is defined as a CSP end, and the CSP end is connected to an input end of the logic control module in the driving controller 10.

In this embodiment, specifically, the control unit 203 includes a NOR gate NOR and an AND gate AND. A first input end of the NOR gate NOR is configured to receive the short-circuit signal short, and a second input end of the NOR gate NOR is configured to receive the delay signal delay. A first input end of the AND gate AND is connected to an output end of the NOR gate NOR, a second input end of the AND gate AND is connected to an enable signal, in which the enable signal is provided by the power supply module of the control apparatus 100, and an output end of the AND gate AND is configured to output the short-circuit protection signal, that is, is connected to the CSP end.

The short-circuit signal generation unit 201 includes a first comparator COMP1, a first RS trigger RS1, as well as a first phase inverter N1 and a second phase inverter N2 connected in series. A negative input end of the first comparator COMP1 is connected to the first end of the current sensing resistor Rcs, that is, is connected to an IFB end of the control apparatus 100. The second end of the current sensing resistor Rcs is grounded. A positive input end of the first comparator COMP1 is connected to a first reference voltage. An output end of the first comparator COMP1 is connected to an input end of the first phase inverter N1. An R end of the first RS trigger RS1 is configured to receive the logic control signal synchronous with the driving signal, an S end of the first RS trigger RS1 is connected to an output end of the second phase inverter N2, and a Q end of the first RS trigger RS1 is configure to output the short-circuit signal short.

The delay signal generation unit 202 includes a first resistor R1 and a first capacitor C1, a NAND gate NAND, as well as a first Schmidt trigger SMT1, a third phase inverter N3 and a fourth phase inverter N4 connected in series. A first end of the first resistor R1 is configured to receive the logic control signal synchronous with the driving signal, that is, the first end of the first resistor R1 is connected to the PULSE end. A second end of the first resistor R1 is connected to a first end of the first capacitor C1. A second end of the first capacitor C1 is grounded. An input end of the first Schmidt trigger SMT1 is connected to the first end of the first capacitor C1. A first input end of the NAND gate NAND is connected to the first end of the first resistor R1, a second input end of the NAND gate NAND is connected to an output end of the fourth phase inverter N4, and an output end of the NAND gate NAND is configured to output the delay signal delay.

An operating process of the short-circuit protection module in this embodiment is described below with reference to FIG. 6.

Figure 6:
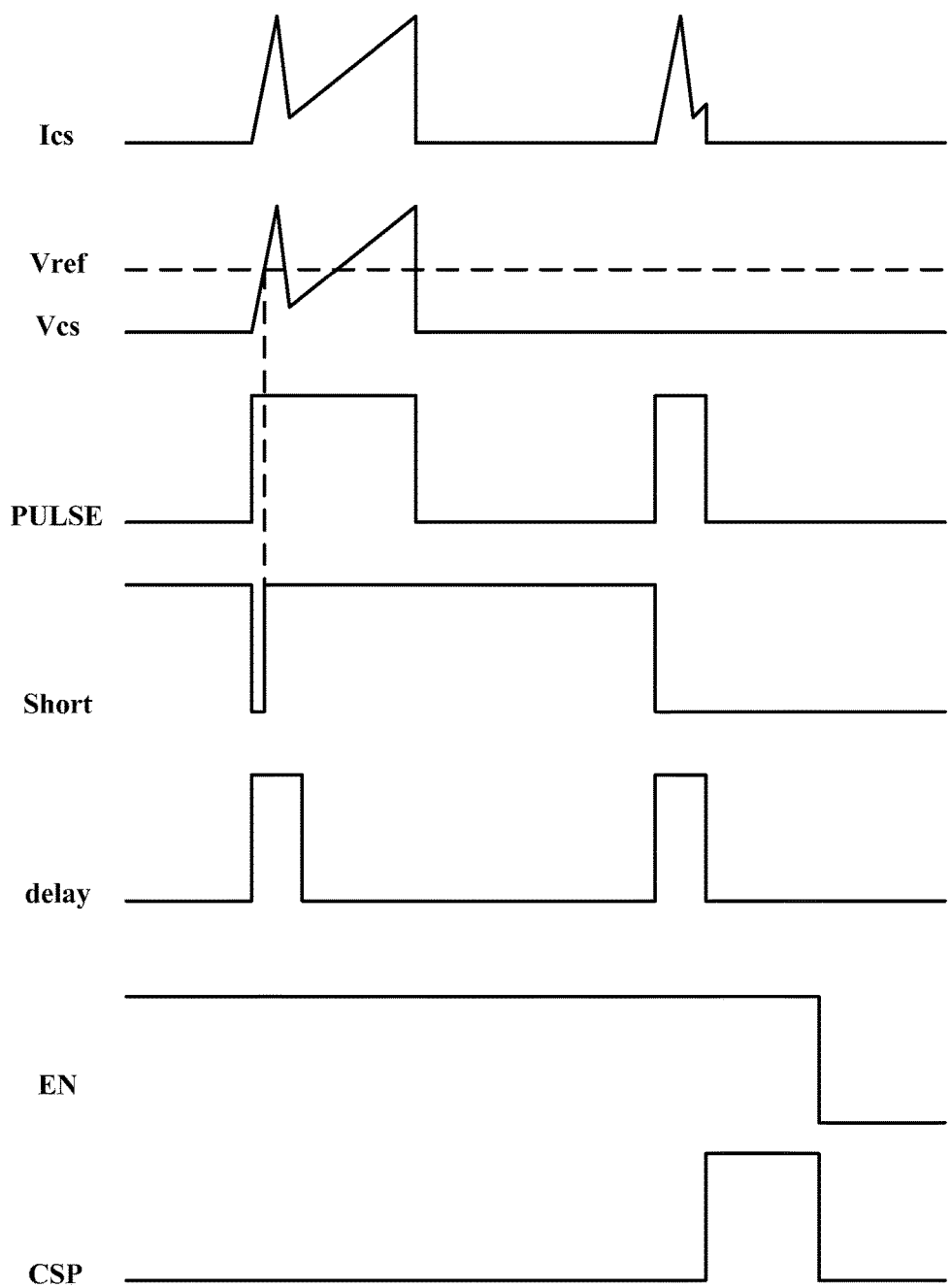
FIG. 6 is a schematic diagram of a working sequence of the short-circuit protection module in FIG. 5.

As shown in FIG. 6, CSP is the short-circuit protection signal, EN is the enable signal, and PULSE is the logic control signal. The short-circuit protection module 20 detects the voltage Vcs across the current sensing resistor Rcs via the IFB end, then the voltage is compared with a predetermined value Vref by the first comparator COMP1, and then the output of the first comparator COMP1 passes through the first phase inverter N1, the second phase inverter N2 and the first RS trigger RS1, to generate the short-circuit signal short.

The short-circuit protection module 20 receives the logic control signal PULSE synchronous with the driving signal for driving the switching transistor Q1 to turn on/off via the PULSE end, and after the logic control signal PULSE passes through the first resistor R1, the first capacitor C1, the first Schmidt trigger SMT1, the third phase inverter N3, the fourth phase inverter N4 and the NAND gate NAND, the delay signal delay is obtained.

The control apparatus 100 is powered on and begins to operate. At this time, EN is at a high level, short is at a high level, CSP is at a low level, and delay is an active-high clock signal. In a first period, within an effective clock period of delay, when the voltage Vcs across the current sensing resistor Rcs is less than Vref, short becomes to be at a low level; when the voltage Vcs across the current sensing resistor Rcs is greater than Vref, short restores to be at a high level, CSP output is kept, and the current sensing resistor is not short-circuited. In a second period, within an effective clock period of delay, if short is continuously at a low level, the current sensing resistor is short-circuited, the CSP output is at a high level until the control chip of the switch-mode power supply is restarted, and the enable signal EN is reset to a low level.

Figure 7:
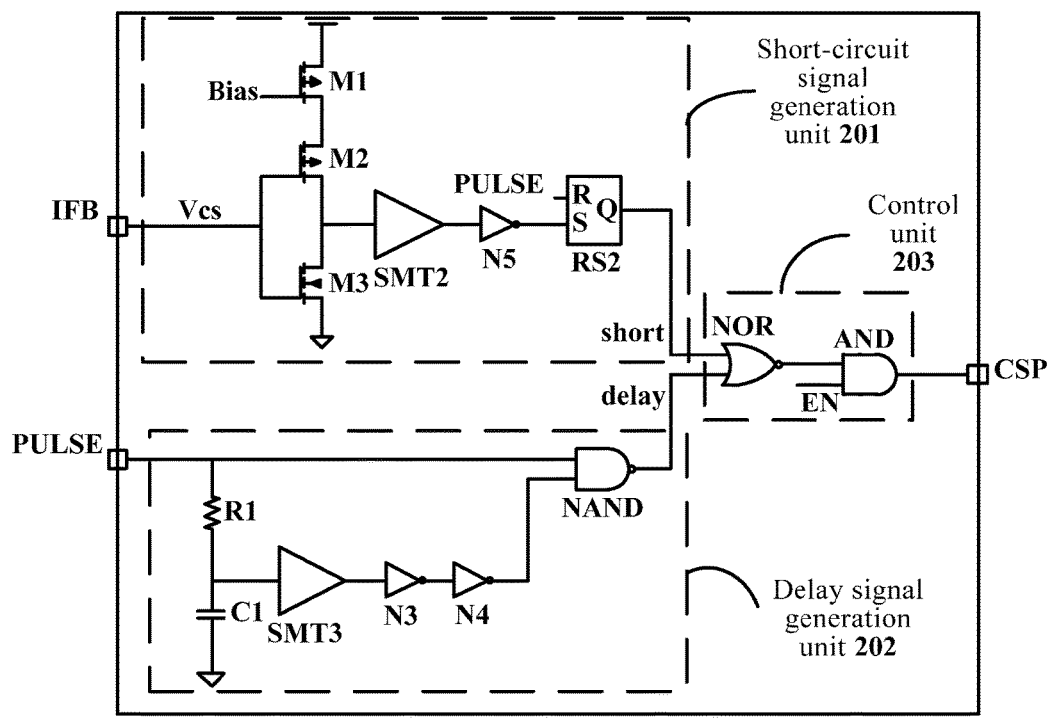
FIG. 7 is a schematic diagram of a short-circuit protection module of a control apparatus of a switch-mode power supply according to another embodiment of the present disclosure.

FIG. 7 is a schematic diagram of a short-circuit protection module of a control apparatus of a switch-mode power supply according to another embodiment of the present disclosure. As shown in FIG. 7, in this embodiment, the short-circuit signal generation unit 201 includes a first MOS transistor M1, a second MOS transistor M2, a third MOS transistor M3, a second RS trigger RS2, as well as a second Schmidt trigger SMT2 and a fifth phase inverter N5 connected in series. A grid of the second MOS transistor M2 is connected to a grid of the third MOS transistor M3, a source of the first MOS transistor M1 is connected to a drain of the second MOS transistor M2, the grid of the second MOS transistor M2 is connected to the first end of the current sensing resistor Rcs (i.e., the IFB end of the control apparatus 100), the second end of the current sensing resistor Rcs is grounded, and a source of the second MOS transistor M2 is connected to a drain of the first MOS transistor M1. An input end of the second Schmidt trigger SMT2 is connected to the source of the second MOS transistor M2. An R end of the second RS trigger RS2 is configured to receive the logic control signal synchronous with the driving signal, that is, the R end of the second RS trigger RS2 is connected to the PULSE end, an S end of the second RS trigger RS2 is connected to an output end of the fifth phase inverter N5, and a Q end of the second RS trigger RS2 is configured to output the short-circuit signal short.

The delay signal generation unit 202 includes a first resistor R1, a first capacitor C1, a NAND gate NAND, as well as a first Schmidt trigger SMT1, a third phase inverter N3 and a fourth phase inverter N4 connected in series. A first end of the first resistor R1 is configured to receive the logic control signal synchronous with the driving signal, that is, the first end of the first resistor R1 is connected to the PULSE end. A second end of the first resistor R1 is connected to a first end of the first capacitor C1. A second end of the first capacitor C1 is grounded. An input end of the first Schmidt trigger SMT1 is connected to the first end of the first capacitor C1. A first input end of the NAND gate NAND is connected to the first end of the first resistor R1, a second input end of the NAND gate NAND is connected to an output end of the fourth phase inverter N4, and an output end of the NAND gate NAND is configured to output the delay signal delay.

Figure 8:
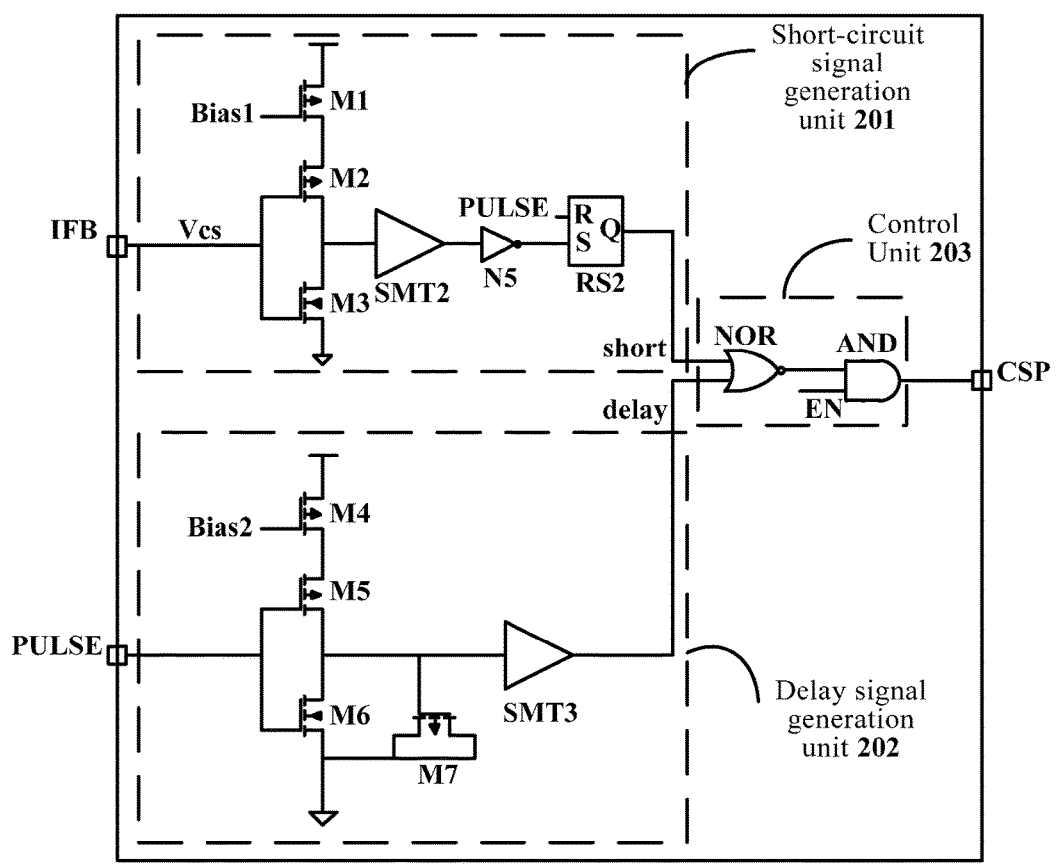
FIG. 8 is a schematic diagram of a short-circuit protection module of a control apparatus of a switch-mode power supply according to still another embodiment of the present disclosure.

FIG. 8 is a schematic diagram of a short-circuit protection module of a control apparatus of a switch-mode power supply according to still another embodiment of the present disclosure. As shown in FIG. 8, in this embodiment, the short-circuit signal generation unit 201 includes a first MOS transistor M1, a second MOS transistor M2, a third MOS transistor M3, a second RS trigger RS2, as well as a second Schmidt trigger SMT2 and a fifth phase inverter N5 connected in series. A grid of the second MOS transistor M2 is connected to a grid of the third MOS transistor M3, a source of the first MOS transistor M1 is connected to a drain of the second MOS transistor M2, the grid of the second MOS transistor M2 is connected to the first end of the current sensing resistor Rcs (i.e., the IFB end of the control apparatus 100), the second end of the current sensing resistor Rcs is grounded, and a source of the second MOS transistor M2 is connected to a drain of the first MOS transistor M1. An input end of the second Schmidt trigger SMT2 is connected to the source of the second MOS transistor M2. An R end of the second RS trigger RS2 is configured to receive the logic control signal synchronous with the driving signal, that is, the R end of the second RS trigger RS2 is connected to the PULSE end, an S end of the second RS trigger RS2 is connected to an output end of the fifth phase inverter N5, and a Q end of the second RS trigger RS2 is configured to output the short-circuit signal short.

The delay signal generation unit 202 includes a fourth MOS transistor M4, a fifth MOS transistor M5, a sixth MOS transistor M6, a seventh MOS transistor M7, and a third Schmidt trigger SMT3. A grid of the fifth MOS transistor M5 is connected to a grid of the sixth MOS transistor M6, a source of the fourth MOS transistor M4 is connected to a drain of the fifth MOS transistor M5, the grid of the fifth MOS transistor M5 is configured to receive the logic control signal synchronous with the driving signal, that is, the grid of the fifth MOS transistor M5 is connected to the PULSE end, a source of the fifth MOS transistor M5 is connected to a drain of the sixth MOS transistor M6, a grid of the seventh MOS transistor M7 is connected to the source of the fifth MOS transistor M5, and a source and a drain of the seventh MOS transistor M7 are connected together and are connected to the drain of the sixth MOS transistor M6. An input end of the third Schmidt trigger SMT3 is connected to the grid of the seventh MOS transistor M7, and an output end of the third Schmidt trigger SMT3 is configured to output the delay signal delay.

It should be understood that the parts of the present disclosure may be implemented by hardware, software, firmware, or a combination thereof. In the foregoing implementation manners, multiple steps or methods may be implemented by using software or firmware that is stored in the memory and that is executed by a proper instruction execution system. For example, if hardware is used for the implementation, similar to in another implementation manner, any one or a combination of the following technologies known in the field may be used for the implementation: a discrete logic circuit having a logic gate circuit configured to implement a logical function for a data signal, an application-specific integrated circuit having a proper combined logic gate circuit, a programmable gate array (PGA), a field programmable gate array (FPGA), or the like.

A person of ordinary skill in the art may understand that all or some steps carried in the method in the foregoing embodiment may be implemented by a program instructing relevant hardware. The program may be stored in a computer readable storage medium. When the program is run, one or a combination of the steps of the method embodiment is performed.

In addition, functional units in the embodiments of the present disclosure may be integrated into one processing module, or each of the units may exist alone physically, or two or more units are integrated into one module. The integrated module may be implemented in a form of hardware, or may be implemented in a form of a software functional module. When the integrated module is implemented in the form of a software functional module and sold or used as an independent product, the integrated module may be stored in a computer-readable storage medium.

The storage medium mentioned above may be a read-only memory, a magnetic disk, a compact disc, or the like.

In the descriptions of this specification, a description of a reference term such as "an embodiment", "some embodiments", "an example", "a specific example", or "some examples" means that a specific feature, structure, material, or characteristic that is described with reference to the embodiment or the example is included in at least one embodiment or example of the present disclosure. In this specification, exemplary descriptions of the foregoing terms do not necessarily refer to a same embodiment or example. In addition, the described specific feature, structure, material, or characteristic may be combined in a proper manner in any one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A control apparatus of a switch-mode power supply, comprising:
   a driving controller, configured to collect an output voltage signal of a feedback winding of the switch-mode power supply, and to generate a driving signal for driving a switching transistor of the switch-mode power supply to turn on or off according to the output voltage signal; and
   a short-circuit protection module, configured to detect a voltage across a current sensing resistor of the switch-mode power supply, to generate a short-circuit protection signal when the switching transistor of the switch-mode power supply is turned on and the voltage across the current sensing resistor is less than a predetermined value within a predetermined period, and to output the short-circuit protection signal to the driving controller, the short circuit protection module comprising:
      a short-circuit signal generation unit, configured to collect the voltage across the current sensing resistor and to generate a short-circuit signal;
      a delay signal generation unit, configured to generate a delay signal according to a logic control signal synchronous with the driving signal;
      a control unit, connected to the short-circuit signal generation unit and the delay signal generation unit respectively, and configured to generate the short-circuit protection signal according to the short-circuit signal and the delay signal,
      wherein the control unit comprises: a first logic circuit with a first input receiving the short-circuit signal and a second input receiving the delay signal generation unit, a second logic circuit receiving an output from the first logic circuit and an enable signal, an output of the second logic circuit configured to produce the short circuit protection signal;
      wherein the first logic circuit is a NOR gate and the second logic circuit is an AND gate; and
   wherein the driving controller is further configured to control the switching transistor to turn off according to the short-circuit protection signal.

2. The control apparatus according to claim 1, wherein the short-circuit signal generation unit comprises:
   a first comparator, wherein a negative input end of the first comparator is connected to a first end of the current sensing resistor, a second end of the current sensing resistor is grounded, and a positive input end of the first comparator is connected to a first reference voltage;
   a first phase inverter and a second phase inverter connected in series, wherein an output end of the first comparator is connected to an input end of the first phase inverter; and
   a first RS trigger, wherein an R end of the first RS trigger is configured to receive the logic control signal synchronous with the driving signal, an S end of the first RS trigger is connected to an output end of the second phase inverter, and a Q end of the first RS trigger is configured to output the short-circuit signal.

3. The control apparatus according to claim 2, wherein the delay signal generation unit comprises:
   a fourth MOS transistor, a fifth MOS transistor, a sixth MOS transistor and a seventh MOS transistor, wherein a grid of the fifth MOS transistor is connected to a grid of the sixth MOS transistor, a source of the fourth MOS transistor is connected to a drain of the fifth MOS transistor, the grid of the fifth MOS transistor is configured to receive the logic control signal synchronous with the driving signal, a source of the fifth MOS transistor is connected to a drain of the sixth MOS transistor, a grid of the seventh MOS transistor is connected to the source of the fifth MOS transistor, and a source and a drain of the seventh MOS transistor are connected together and are connected to the drain of the sixth MOS transistor; and
   a third Schmidt trigger, wherein an input end of the third Schmidt trigger is connected to the grid of the seventh MOS transistor, and an output end of the third Schmidt trigger is configured to output the delay signal.

4. The control apparatus according to claim 1, wherein the short-circuit signal generation unit comprises:
   a first MOS transistor, a second MOS transistor and a third MOS transistor, wherein a grid of the second MOS transistor is connected to a grid of the third MOS transistor, a source of the first MOS transistor is connected to a drain of the second MOS transistor, the grid of the second MOS transistor is connected to a first end of the current sensing resistor, a second end of the current sensing resistor is grounded, and a source of the second MOS transistor is connected to a drain of the first MOS transistor;
   a second Schmidt trigger and a fifth phase inverter connected in series, wherein an input end of the second Schmidt trigger is connected to the source of the second MOS transistor; and
   a second RS trigger, wherein an R end of the second RS trigger is configured to receive the logic control signal synchronous with the driving signal, an S end of the second RS trigger is connected to an output end of the fifth phase inverter, and a Q end of the second RS trigger is configured to output the short-circuit signal.

5. The control apparatus according to claim 4, wherein the delay signal generation unit comprises:
   a fourth MOS transistor, a fifth MOS transistor, a sixth MOS transistor and a seventh MOS transistor, wherein a grid of the fifth MOS transistor is connected to a grid of the sixth MOS transistor, a source of the fourth MOS transistor is connected to a drain of the fifth MOS transistor, the grid of the fifth MOS transistor is configured to receive the logic control signal synchronous with the driving signal, a source of the fifth MOS transistor is connected to a drain of the sixth MOS transistor, a grid of the seventh MOS transistor is connected to the source of the fifth MOS transistor, and a source and a drain of the seventh MOS transistor are connected together and are connected to the drain of the sixth MOS transistor; and
   a third Schmidt trigger, wherein an input end of the third Schmidt trigger is connected to the grid of the seventh MOS transistor, and an output end of the third Schmidt trigger is configured to output the delay signal.

6. The control apparatus according to claim 1, wherein the delay signal generation unit comprises:
   a first resistor and a first capacitor, wherein a first end of the first resistor is configured to receive the logic control signal synchronous with the driving signal, a second end of the first resistor is connected to a first end of the first capacitor, and a second end of the first capacitor is grounded;
   a first Schmidt trigger, a third phase inverter and a fourth phase inverter connected in series, wherein an input end of the first Schmidt trigger is connected to the first end of the first capacitor; and a NAND gate, wherein a first input end of the NAND gate is connected to the first end of the first resistor, a second input end of the NAND gate is connected to an output end of the fourth phase inverter, and an output end of the NAND gate is configured to output the delay signal.

7. The control apparatus according to claim 1, wherein the delay signal generation unit comprises:
a fourth MOS transistor, a fifth MOS transistor, a sixth MOS transistor and a seventh MOS transistor, wherein a grid of the fifth MOS transistor is connected to a grid of the sixth MOS transistor, a source of the fourth MOS transistor is connected to a drain of the fifth MOS transistor, the grid of the fifth MOS transistor is configured to receive the logic control signal synchronous with the driving signal, a source of the fifth MOS transistor is connected to a drain of the sixth MOS transistor, a grid of the seventh MOS transistor is connected to the source of the fifth MOS transistor, and a source and a drain of the seventh MOS transistor are connected together and are connected to the drain of the sixth MOS transistor; and
a third Schmidt trigger, wherein an input end of the third Schmidt trigger is connected to the grid of the seventh MOS transistor, and an output end of the third Schmidt trigger is configured to output the delay signal.

8. The control apparatus according to claim 1, further comprising:
an overcurrent protection module, connected to the driving controller, and configured to detect a current flowing through the switching transistor, to generate an overcurrent protection signal when the current flowing through the switching transistor is greater than a threshold and to output the overcurrent protection signal to the driving controller, such that the driving controller controls the switching transistor to turn off according to the overcurrent protection signal.

9. The control apparatus according to claim 8, wherein the driving controller comprises:
a sampling module, wherein an input end of the sampling module is configured to receive the output voltage signal of the feedback winding, and the sampling module is configured to sample the output voltage signal of the feedback winding;
an error amplifier, wherein a negative input end of the error amplifier is connected to an output end of the sampling module; and
a constant-voltage and constant-current control module, a logic control module, and a driving module connected in series, wherein an input end of the constant-voltage and constant-current control module is connected to the output end of the error amplifier, the driving module is configured to generate the driving signal for driving the switching transistor to turn on or off according to a logic signal output by the logic control module, and the overcurrent protection module and the short-circuit protection module are connected to the logic control module.

10. The control apparatus according to claim 1, wherein the predetermined period is greater than or equal to a discharge period of a switch capacitor connected in parallel to an output end of the switching transistor, in which the switch capacitor consists of a parasitic capacitor of the switching transistor and a parasitic capacitor of a transformer of the switch-mode power supply.

11. The control apparatus according to claim 1, wherein the short-circuit signal generation unit comprises:

a first comparator, wherein a negative input end of the first comparator is connected to a first end of the current sensing resistor, a second end of the current sensing resistor is grounded, and a positive input end of the first comparator is connected to a first reference voltage;
a first phase inverter and a second phase inverter connected in series, wherein an output end of the first comparator is connected to an input end of the first phase inverter; and
a first RS trigger, wherein an R end of the first RS trigger is configured to receive the logic control signal synchronous with the driving signal, an S end of the first RS trigger is connected to an output end of the second phase inverter, and a Q end of the first RS trigger is configured to output the short-circuit signal.

12. The control apparatus according to claim 1, wherein the short-circuit signal generation unit comprises:
a first MOS transistor, a second MOS transistor and a third MOS transistor, wherein a grid of the second MOS transistor is connected to a grid of the third MOS transistor, a source of the first MOS transistor is connected to a drain of the second MOS transistor, the grid of the second MOS transistor is connected to a first end of the current sensing resistor, a second end of the current sensing resistor is grounded, and a source of the second MOS transistor is connected to a drain of the first MOS transistor;
a second Schmidt trigger and a fifth phase inverter connected in series, wherein an input end of the second Schmidt trigger is connected to the source of the second MOS transistor; and
a second RS trigger, wherein an R end of the second RS trigger is configured to receive the logic control signal synchronous with the driving signal, an S end of the second RS trigger is connected to an output end of the fifth phase inverter, and a Q end of the second RS trigger is configured to output the short-circuit signal.

13. The control apparatus according to claim 12, wherein the delay signal generation unit comprises:
a first resistor and a first capacitor, wherein a first end of the first resistor is configured to receive the logic control signal synchronous with the driving signal, a second end of the first resistor is connected to a first end of the first capacitor, and a second end of the first capacitor is grounded;
a first Schmidt trigger, a third phase inverter and a fourth phase inverter connected in series, wherein an input end of the first Schmidt trigger is connected to the first end of the first capacitor; and
a NAND gate, wherein a first input end of the NAND gate is connected to the first end of the first resistor, a second input end of the NAND gate is connected to an output end of the fourth phase inverter, and an output end of the NAND gate is configured to output the delay signal.

14. The control apparatus according to claim 1, wherein the delay signal generation unit comprises:
a first resistor and a first capacitor, wherein a first end of the first resistor is configured to receive the logic control signal synchronous with the driving signal, a second end of the first resistor is connected to a first end of the first capacitor, and a second end of the first capacitor is grounded;
a first Schmidt trigger, a third phase inverter and a fourth phase inverter connected in series, wherein an input end of the first Schmidt trigger is connected to the first end of the first capacitor; and a NAND gate, wherein a first input end of the NAND gate is connected to the first end of the first resistor, a second input end of the NAND gate is connected to an output end of the fourth phase inverter, and an output end of the NAND gate is configured to output the delay signal.

15. The control apparatus according to claim 2, wherein the delay signal generation unit comprises:
a first resistor and a first capacitor, wherein a first end of the first resistor is configured to receive the logic control signal synchronous with the driving signal, a second end of the first resistor is connected to a first end of the first capacitor, and a second end of the first capacitor is grounded;
a first Schmidt trigger, a third phase inverter and a fourth phase inverter connected in series, wherein an input end of the first Schmidt trigger is connected to the first end of the first capacitor; and
a NAND gate, wherein a first input end of the NAND gate is connected to the first end of the first resistor, a second input end of the NAND gate is connected to an output end of the fourth phase inverter, and an output end of the NAND gate is configured to output the delay signal.

16. The control apparatus according to claim 4, wherein the delay signal generation unit comprises:
a first resistor and a first capacitor, wherein a first end of the first resistor is configured to receive the logic control signal synchronous with the driving signal, a second end of the first resistor is connected to a first end of the first capacitor, and a second end of the first capacitor is grounded;
a first Schmidt trigger, a third phase inverter and a fourth phase inverter connected in series, wherein an input end of the first Schmidt trigger is connected to the first end of the first capacitor; and
a NAND gate, wherein a first input end of the NAND gate is connected to the first end of the first resistor, a second input end of the NAND gate is connected to an output end of the fourth phase inverter, and an output end of the NAND gate is configured to output the delay signal.

17. The control apparatus according to claim 1, wherein the delay signal generation unit comprises:
a fourth MOS transistor, a fifth MOS transistor, a sixth MOS transistor and a seventh MOS transistor, wherein a grid of the fifth MOS transistor is connected to a grid of the sixth MOS transistor, a source of the fourth MOS transistor is connected to a drain of the fifth MOS transistor, the grid of the fifth MOS transistor is configured to receive the logic control signal synchronous with the driving signal, a source of the fifth MOS transistor is connected to a drain of the sixth MOS transistor, a grid of the seventh MOS transistor is connected to the source of the fifth MOS transistor, and a source and a drain of the seventh MOS transistor are connected together and are connected to the drain of the sixth MOS transistor; and
a third Schmidt trigger, wherein an input end of the third Schmidt trigger is connected to the grid of the seventh MOS transistor, and an output end of the third Schmidt trigger is configured to output the delay signal.

18. A switch-mode power supply, comprising:
a rectification module, configured to rectify an input AC voltage into a DC voltage;
a transformer, comprising a primary winding, a secondary winding and a feedback winding;
a rectification and filtering module, connected to the secondary winding of the transformer, and configured to rectify and filter a voltage output by the secondary winding;
a switching transistor and a current sensing resistor, wherein a first output end of the switching transistor is connected to the primary winding of the transformer, a second output end of the switching transistor is connected to a first end of the current sensing resistor, and a second end of the current sensing resistor is grounded; and
a control apparatus, comprising:
a driving controller, connected to the feedback winding and an input end of the switching transistor respectively, and configured to collect an output voltage signal of the feedback winding, and to generate a driving signal for driving the switching transistor to turn on or off according to the output voltage signal; and
a short-circuit protection module, connected to the driving controller and the first end of the current sensing resistor respectively, and configured to detect a voltage across the current sensing resistor, to generate a short-circuit protection signal when the switching transistor is turned on and the voltage across the current sensing resistor is less than a predetermined value within a predetermined period, and to output the short-circuit protection signal to the driving controller, the short circuit protection module comprising:
a short-circuit signal generation unit, configured to collect the voltage across the current sensing resistor and to generate a short-circuit signal;
a delay signal generation unit, configured to generate a delay signal according to a logic control signal synchronous with the driving signal;
a control unit, connected to the short-circuit signal generation unit and the delay signal generation unit respectively, and configured to generate the short-circuit protection signal according to the short-circuit signal and the delay signal,
wherein the control unit comprises: a first logic circuit with a first input receiving the short-circuit signal and a second input receiving the delay signal generation unit, a second logic circuit receiving an output from the first logic circuit and an enable signal, an output of the second logic circuit configured to produce the short circuit protection signal;
wherein the first logic circuit is a NOR gate and the second logic circuit is an AND gate; and
wherein the driving controller is further configured to control the switching transistor to turn off according to the short-circuit protection signal.

* * * * *